United States Patent
Hu et al.

(10) Patent No.: US 8,291,858 B2
(45) Date of Patent: Oct. 23, 2012

(54) MOVABLE JIG FOR SILICON-BASED THIN FILM SOLAR CELL

(75) Inventors: Shengming Hu, Shenzhen (CN); Yi Li, Shenzhen (CN); Zhubing He, Shenzhen (CN); Zhijiang Li, Shenzhen (CN); Jianhua Zhou, Shenzhen (CN); Chunzhu Wang, Shenzhen (CN)

(73) Assignee: Shenzhen Trony Science & Technology Development Co., Ltd., Shenzhen (CN)

( * ) Notice: Subject to any disclaimer, the term of this patent is extended or adjusted under 35 U.S.C. 154(b) by 0 days.

(21) Appl. No.: 13/389,484

(22) PCT Filed: Oct. 21, 2010

(86) PCT No.: PCT/CN2010/001656
§ 371 (c)(1), (2), (4) Date: Feb. 8, 2012

(87) PCT Pub. No.: WO2011/153672
PCT Pub. Date: Dec. 15, 2011

(65) Prior Publication Data
US 2012/0142137 A1   Jun. 7, 2012

(30) Foreign Application Priority Data

Jun. 11, 2010  (CN) .......................... 2010 1 0198739

(51) Int. Cl.
*C23C 16/59*  (2006.01)
*H01L 31/18*  (2006.01)

(52) U.S. Cl. .................... 118/723 E; 427/457; 427/533; 438/485; 156/345.44

(58) Field of Classification Search .................. 427/457, 427/533; 438/485; 118/723 E; 156/345.44
See application file for complete search history.

(56) References Cited

U.S. PATENT DOCUMENTS

| | | | | |
|---|---|---|---|---|
| 4,723,508 A | * | 2/1988 | Yamazaki et al. | 118/723 E |
| 5,538,610 A | * | 7/1996 | Gesche et al. | 204/298.15 |
| 2012/0139416 A1 | * | 6/2012 | Li | 315/85 |
| 2012/0142137 A1 | * | 6/2012 | Hu et al. | 438/57 |
| 2012/0142138 A1 | * | 6/2012 | Li | 438/57 |

* cited by examiner

*Primary Examiner* — Sylvia R. MacArthur
(74) *Attorney, Agent, or Firm* — Anova Law Group, PLLC; Wenye Tan

(57) ABSTRACT

A movable jig for a silicon-based thin film solar cell comprises parallel electrode plates (203,208), a supporting frame and a signal feed-in assembly (201). The supporting frame is a movable frame and its side frame (216) is grounded. A shield device is set on the jig or among jig arrays themselves for preventing from being disturbed. The signal feed-in assembly is a conductor and its middle portion and head portion form a ladder cylinder, and one end surface (201-1) of the signal feed-in assembly is triangular and can surface contact and connect with a sunken triangular feed-in port (203-1) in the center area of the back surface of the cathode plate (203) of the electrode plates, so the radio frequency/the very high frequency power supply signal can be fed in. Through the way of the surface feed-in in the center of the electrode plate, the consumption caused by the feeder distance in the way of one point feed-in or multipoint feed-in can be reduced, the large area stable discharge of the uniform electric field can be obtained, the production efficiency can be increased and the cost can be decreased.

14 Claims, 3 Drawing Sheets

MOVABLE JIG FOR SILICON-BASED THIN FILM SOLAR CELL

FIELD OF THE INVENTION

The present invention generally relates to solar cell technologies and, more particularly, to a movable jig for silicon thin film solar cells usable inside a vacuum chamber.

BACKGROUND

Currently, silicon thin film solar cells often use plasma enhanced chemical vapor deposition (PECVD) to construct single-junction or multi junction photovoltaic PIN film layers. This type of radio-frequency (RF) capacitively-coupled parallel plate reactor is commonly used in the thin film solar cell industry. PECVD is generally conducted in a reaction chamber using the electrode plate components or the electrode array composed of electrode plates. Industry-wide, the electrode with a supporting frame is usually called a jig, a holder, a clamping unit, or a fixture, and the plasma chemical vapor deposition apparatus with installed holder(s) inside the chamber is often called the "deposition box," i.e., the reactor chamber.

The RF capacitively-coupled parallel plate reactor has been widely used for making large-area thin film deposition of various materials, such as amorphous silicon, amorphous silicon-germanium, silicon carbide, silicon nitride and silicon oxide, etc.

The silicon thin film solar cell sector is an important branch of the solar industry, and the parallel electrode plate capacitive discharge model becomes one of the core technologies of the solar industry. Holders for 13.56 MHz RF are widely used in high-speed amorphous silicon thin film deposition and have high efficiency and low process cost. With the rising demand for silicon thin film technology, more attention has been given to microcrystalline and nanocrystalline silicon thin film materials.

However, in a microcrystalline environment, plasma generated by 13.56 MHz RF may have low plasma concentration, low deposition rate, long deposition period to reach targeted film thickness, and significant background pollution. Thus, the prepared thin film often has high impurity and poor optical properties, which seriously affects the quality and performance of the products. How to make high-speed deposition becomes key for crystalline silicon thin-film technology to successfully serve the industry.

Very high frequency (VHF) is referred to the legitimate frequency which is twice or more of 13.56 MHz. In the industry, the VHF mostly used is generally in the range of 27.12~100 MHz. However, in the capacitive discharge model, standing wave effect and skin effect caused by VHF become very obvious, and these effects become stronger when the driving frequency increases. Professor M. A. Lieberman of University of California, Berkeley made a thorough investigation on these two effects. His research results show that the critical condition for VHF PECVD deposition of uniform thin films is that the free space wavelength of excitation frequency ($\lambda_0$) is much larger than the capacitive discharge electrode chamber size factor (X), and the skin depth ($\delta$) is much larger than the thickness tolerance factor ($\eta_0$). For example, on 1 $m^2$ of discharging area and with an excitation frequency of 60 MHz, $\lambda_0 \approx X$ and $\delta \approx \eta$. Therefore, under this excitation frequency, the skin effect and the standing wave effect become very obvious, leading to an uneven discharge on the electrode plate of 1 $m^2$.

Thus, how to achieve a large area of uniform discharge driven by VHF is one of the technical problems to be resolved for the crystalline silicon thin-film technology. This also caused great interest in the industry. In 2003, U.S. Patent 2003/0150562A1 disclosed a method using a magnetic mirror in the capacitively-coupled discharge to improve the inhomogeneity caused by VHF. Chinese patents 200710150227.4, 200710150228.9, and 200710150229.3 disclosed three electrode designs of VHF, applying different feed-in forms of VHF signals to obtain uniform electric fields.

However, the following problems may still remain: 1) The electrodes in the VHF-PECVD chamber have complex design structures; 2) One reason for the continuous improvement is that the constant assembly/disassembly and cleaning of the reaction chamber and electrodes can cause abnormal deformation of the electrodes; 3) The multi-point feed-in structures disclosed in the existing patents may have a small contact surface, which requires symmetrical paths of individual feed-in points and there is no contact between the bonding conductors at the feed-in points and the cathode plate. More specifically, a shield of isolation may be needed between the bonding conductor and the cathode plate for effective discharge. These structural designs have relatively harsh actual requirements, have too many determination factors for uniform discharge, and cannot meet the actual production needs such as disassembly and cleaning.

Therefore, for the equipment used by the industry, a single point feed-in becomes the mainstream design. But due to the standing wave effect and the skin effect, current single-point feed-in structures cannot meet the requirement for increasing the high feed-in frequency. Thus, further development and improvement may be needed to make the existing deposition holders and the electrodes more practical to meet the current market demand, to improve the quality, and to reduce the cost. Meanwhile, it is also a trend to use CVD holder system capable of processing or depositing multiple glasses. Therefore, to meet the demand of mass production, it is of great practical significance to apply an effective feed-in model of VHF to design and develop industrial products.

CONTENTS OF THE INVENTION

On the basis of the above analysis of the current technical difficulties for silicon crystalline thin films, the present invention intends to solve the problems such as the non-uniformity and inconsistency of VHF-driven high-speed deposition thin film. Accordingly, the technical solutions include: parallel electrode plates and a signal feed-in component, also include a supporting frames, while the supporting frame is a movable frame with grounded side frames and insulation and shielding arrangement.

The signal feed-in component includes a waist and a head forming a cylindrical and stair-shaped conductor, one end of which is of a triangular shape and makes surface contact with a feed-in port of a cathode plate of the electrode plates. The feed-in port is located in a hollowed triangular area at the center of the backside of the electrode plate. Further, a shielding layer of the electrode plate feeding-in RF/VHF power supply signals is connected to ground.

The technical solutions also include: sliding devices are installed at the bottom of side frames of the movable frame, the electrode plates are arranged in the supporting frame to form the holder, and anti-interference metal shielding screens are arranged between holders or holder arrays.

The insulation and shielding arrangement includes a grounded metal shielding cover of the shielding layer for the cathode plate of the electrode plates, and a through hole arranged on the shielding cover.

The shielding layer includes an insulation layer between a metal shielding cover and the back of the cathode plate of the electrode plates. The insulation and shielding of the feed-in component includes an outside shielding layer and an insulation layer for the metal feed-in core.

A shielding cover of the cathode plate includes a ceramic insulation layer and a shielding layer, the shielding cover covers entire back and side surface of the cathode plate.

A holder array according to the technical solutions includes an electrode array separated by a certain discharging distance formed by a combination of several sets of electrode plates and the supporting frame or a holder array formed by the electrode array. The signal feed-in component includes a metal feed-in core, which is a conductor formed by RF/VHF feed lines, with a waist covered by a high-temperature-tolerant ceramic insulation layer.

According to the present invention, solutions for surface feed-in mode in the holder include: arranging electrode plates in parallel and placed in a supporting frame, and providing at least one signal feed-in component. One end of the signal feed-in component is of a triangular shape. The solutions also include transferring, in a surface feed-in mode, RF/VHF power supply signals to a feed-in port of a cathode plate of the electrode plates, wherein the feed-in port is located in a hollowed triangular area at the center of the backside of the cathode plate, and forming an electrode array in the supporting frame to discharge the RF/VHF power supply signals. The signal feed-in component includes a waist and a head forming a cylindrical and stair-shaped conductor.

The electrode array includes the electrode plates arranged in the supporting frame and the signal feed-in component, which form the movable holder for discharging the power supply signals, and anti-interference metal shielding screens are placed between holders in a holder array.

The holder array includes multiple feed-in components and corresponding electrode plates respectively connected with the feed-in components in a surface feed-in mode to form an electrode array separated by a certain discharging distance.

The signal feed-in component includes a metal feed-in core, which is a conductor formed by RF/VHF feed lines, with a waist covered by a ceramic insulation layer.

Advantages of disclosed embodiments of the present invention include, unlike the slot-based cathode plate with side feed-in mode, a larger discharge area, higher uniformity and more stable discharge, smaller access capacitance, less RF interference between holders, and weaker standing wave and skin effects. The present invention may be applied in large area uniform discharge with any legitimate VHF in the range of 27.12 MHz~200 MHz to increase productivity and to reduce solar cell cost.

By overcoming the problems of the current multi-point feed-in structures such as small contact surface and requirement of symmetrical paths of individual feed-in points, the surface feed-in mode according to the present invention achieves complete insulation shielding, and avoids the non-contacting requirements between the connecting conductor of the feed-in signal and the cathode plate. When there is a complete insulation shielding between the discharge bodies and the signal feed-in components, signal interference can be prevented and an effective discharge can be achieved.

Although, for the equipment used by the industry, single-point feed-in becomes the mainstream design, due to the standing wave effect and the skin effect, current single-point feed-in structures cannot meet the requirement for increasing the high feed-in frequency. While for the multi-point feed-in, because the structural designs have relatively harsh actual requirements and have too many determination factors for uniform discharge, it may be difficult to meet the actual production needs such as disassembly and cleaning.

BRIEF DESCRIPTION OF THE DRAWINGS

In FIG. 1-8, the holder 02 includes the electrode plates and the supporting frames. The electrode plates include anode plate(s) 208, cathode plate(s) 203, and insulation layer 207 placed between the cathode plate 203 and cathode shielding cover 204. The triangular shaped surface 201-1 of one end of the feed-in strip 201 makes surface contact with the feed-in port 203-1 located at a hollowed triangular area at the center of the backside of the cathode electrode plate, and feeds-in RF/VHF power supply signals. The waist of feed-in strip 201 are covered with a ceramic insulation cover 202. The supporting frame consists of a top fixed plate 214, a bottom fixed plate 221, and side frames 216, the bottom of which is installed with grounded metal rollers 218. Grounded metal guide slots 209 are arranged on both the top fixed plate 214 and the bottom fixed plate 221. Holder 02 discharges in the vacuum chamber 01, depositing P-I-N film on the substrate 206. The vacuum chamber 01 contains gas system access port 101, power system access port 102, vacuum system access port 105, and tracks 104

Figure 1:
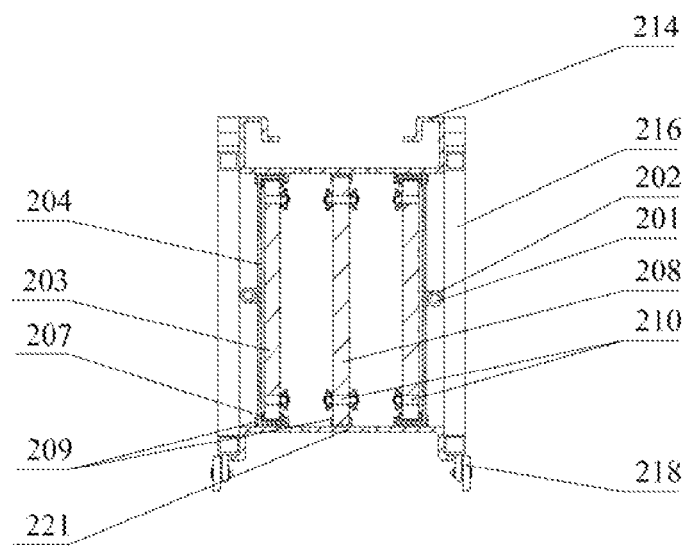
FIG. 1 is a cross-section pictorial view of the movable holder according to the present invention.
Figure 2:
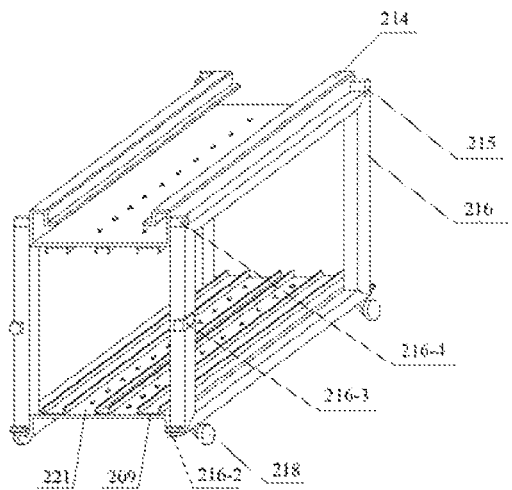
FIG. 2 is a structural diagram of a supporting frame.
Figure 3:
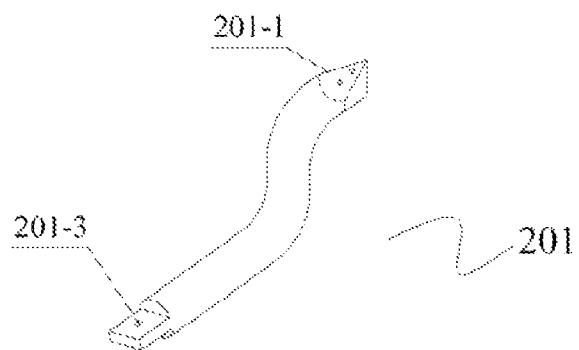
FIG. 3 is a structural diagram of cylindrical signal feed-in component 201 (referred as feed-in component or feed-in strip).
Figure 4:
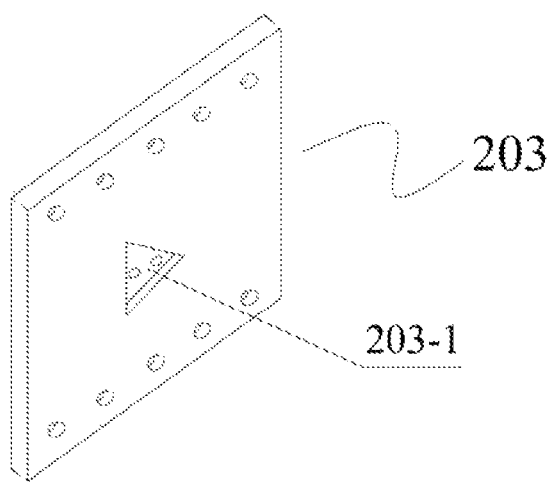
FIG. 4 is a structural diagram of cathode plate 203.
Figure 5:
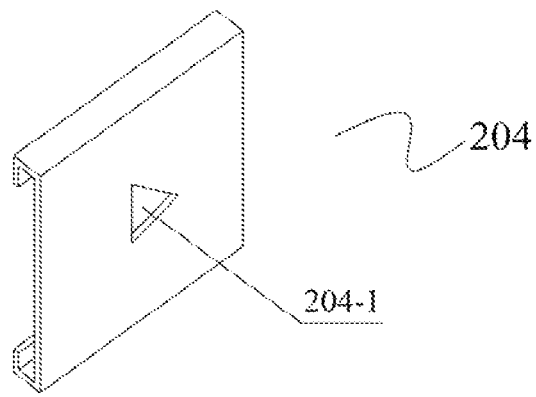
FIG. 5 is a structural diagram of cathode shielding cover 204.
Figure 6:
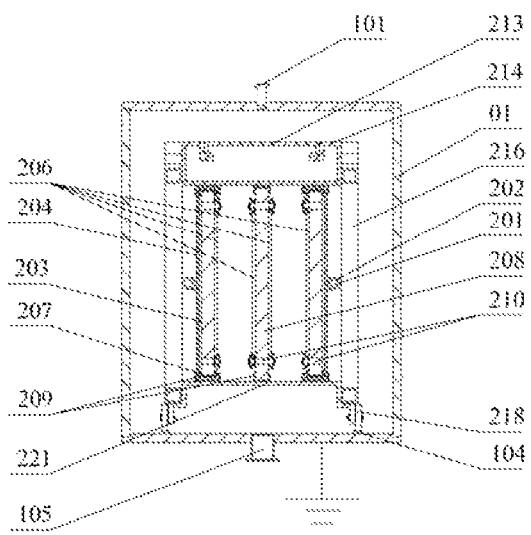
FIG. 6 is a schematic diagram of vertical electrode plates according to the first embodiment of the present invention.

According to the present invention, the design of a surface feed-in holder achieves the purposes of the present invention mentioned above, which overcomes many difficult-to-solve problems of the existing multi-point feed-in VHF-PEVCD deposition techniques for crystalline silicon-based thin films, such as the complex electrode structures of the reaction chamber, easy electrode deformation, small contact area, and requiring symmetrical paths among individual feed-in points and complete shielding, etc. These problems do not exist in surface feed-in holder design according to the present invention. More particularly, by high-efficiently using dual working surfaces of anode plates, large area of uniform electric fields can be obtained to discharge electricity inside the chamber. Further, CVD holder systems capable of processing or depositing multiple glass plates are used, with effective VHF surface feed-in models, to achieve operational industrial production processes and to meet the needs of mass production of the silicon-based thin film solar cells.

The contributions of the present invention also include providing fundamental solutions to the uniformity and consistency of VHF power-driven high-speed deposition film. Holder 02 is placed in the vacuum chamber 01, and holder 02 includes parallel electrode plates and shielding arrangements. The parallel electrode plates include cathode plates 203 and anode plates 208. The feed-in port 203-1 is of a triangular shape, and one end 201-1 of the signal feed-in component 201 is of a triangular shape, while the signal feed-in component 201 is of a stair or step shape including a cylinder waist and a triangular-shaped end surface 201-1. The triangular-shaped end surface 201-1 corresponds to the triangular surface of the feed-in port 203-1 located at a hollowed triangular area at the center of the backside of cathode electrode plate 203 having a cathode shielding cover 204. The waist of the signal feed-in component is of the cylinder structure for easy shielding, the other end 201-3 of the signal feed-in component connects to the negative end of the RF/VHF power supply and power matching device (not shown), and one of the triangular end surface makes surface contacts with the feed-in port of the electrode plate in the moveable frame with grounded side frames, both of them having insulation and shielding protective devices (not shown). The grounded metal guide slots 209 provide conductive grounding and fixing functionalities.

DETAILED DESCRIPTION OF THE EMBODIMENTS

The followings further illustrate the principle of movable holder 02 according to the present invention with accompanying FIGS. 1-8. Holder 02 includes a supporting frame and electrode plates, and the supporting frame includes a bottom fixed plate 221, a top fixed plate 214, side frames 216, and grounded metal rollers 218 installed at the bottom of side frames 216. Grounded metal guide slots 209 are arranged on both the top fixed plate 214 and the bottom fixed plate 221.

The electrode plates include anode plate(s) 208 and cathode plate(s) 203, and the insulation layer or strip 207 is placed between cathode plate 203 and cathode shielding cover 204. The feed-in port 203-1 of RF/VHF power supply signal is located at the center of the backside of the cathode electrode plate 203 and inside a hollowed triangular area. The feed-in strip 201 is a cylindrical stair-shaped conductor with a waist and a head, and one end surface 201-1 (i.e., surface of the head or the feed-in pad) is of a triangular shape and makes surface contact with the feed-in port 203-1 of the cathode electrode plate 203. Further, the waist of the feed-in strip 201 is covered by a ceramic insulation layer 202.

The combination of several sets of electrode plates and the supporting frame form an electrode array separated by a certain discharging distance or a holder array formed with the electrode array. Anti-interference metal shielding screens are arranged between the holders in the holder array. The holders or the holder array discharge in the vacuum chamber 01. The vacuum chamber 01 includes gas system access port 101, power system access port 102, and vacuum system access port 105. Further, at the front of the vacuum chamber 01, a movable door is installed and can be opened and closed, while tracks 104 is installed inside of the vacuum chamber 01.

The First Embodiment

The electrode plates are arranged vertically, and the feed-in port of cathode is of a triangular shape, and the feed-in component is of a cylinder shape. The followings illustrate this embodiment of the present invention in detail together with accompanying FIGS. 1-6.

According to the present invention, the movable holder of thin-film solar cells uses a VHF power supply with a working frequency of approximately 27.12-100 MHz. The vacuum chamber 01 is used to achieve a vacuum state, and the gas system access port 101 is configured on the top of vacuum chamber 01. The vacuum chamber 01 also includes power system access port 102, vacuum system access port 105, and a moveable door is installed at the front of the vacuum chamber 01. Holder 02 discharges (electricity) in the vacuum environment to form a large-area uniform electric field inside the chamber, and the substrates 206 in the chamber are deposited with heterojunction P-I-N laminated film to form thin-film solar cell plates or so-called chips, which are suitable for mass production.

The entrance of the fixed gas pipe on holder 02 is coupled with the nozzle of the gas system port 101 inside the vacuum chamber 01. One end of the power cord is connected with the power connector of holder 02, and the other end of the power cord is connected with the access port 102 of VHF power system. The insulation layer or strip 207 is placed between cathode plate 203 and cathode shielding cover 204, and the triangular feed-in surface 201-1 on the head of feed-in strip 201 is in surface contact with the feed-in port 203-1 on the backside of cathode plate 203 to feed-in RF/VHF power supply signals. The through hole port 201-3 at the other end of the feed-in strip 201 is connected with the power connector of holder 02, and the waist of the feed-in strip 201 is covered by a ceramic insulation layer 202 to prevent the feed-in strip 201 from contacting the cathode shielding cover 204.

The cathode shielding cover 204 has a through hole 204-1 corresponding to the location of the feed-in port 203-1 of cathode plate 203 such that the feed-in strip 201 can come out of the cathode plate 203 without contacting the cathode shielding cover 204. The feed-in strip 201 may be made of metal copper with desired conductivity, and both the cathode shielding cover 204 and the anode plates 208 are grounded. The pre-coated substrates 206 are placed in the supporting frame of the holder 02, and the holder 02 is pushed into the vacuum chamber 01 along the tracks 104.

The moveable door at the front of the vacuum chamber is then closed, and a desired vacuum state can be reached through the vacuum system. Further, argon gas is filled in the chamber. When the pressure in the chamber reaches approximately 60 Pa, the VHF power supply is turned on to discharge electricity to clean the chamber, and the power is turned off thereafter. Further, a high-degree of vacuum of approximately $5.0 \times 10^{-4}$ Pa is reached, and argon gas is filled in to clean the chamber. Finally, the process gas is fed in the chamber at approximately 5 slpm to start the deposition process and to complete vapor deposition film.

The Second Embodiment

The feed-in port on the cathode plate is of a triangular shape, and the feed-in component is of a cylinder shape.

Figure 7:
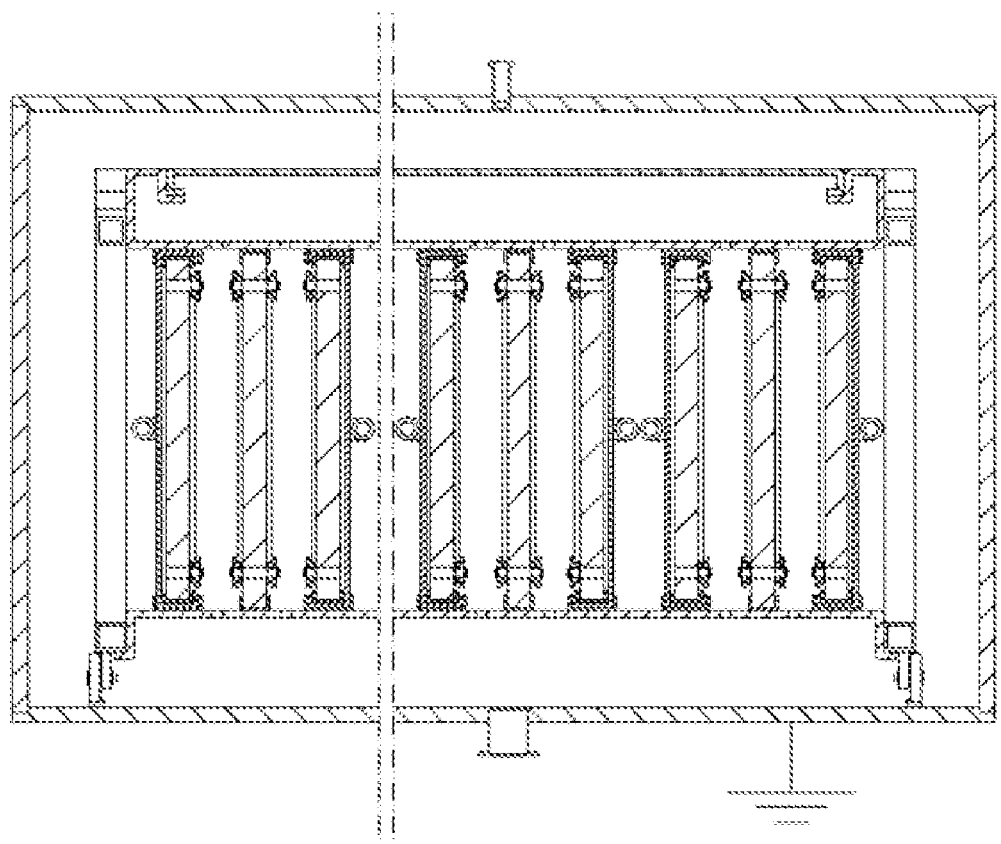
FIG. 7 is the second embodiment according to the invention, including 24 substrates, 12 cathode plates, and 6 anode plates.

The holder in FIG. 7 is similar to that in the first embodiment. In this embodiment, a vertical deposition chamber is used. Six (6) anode plates 208 and twelve (12) cathode plates 203 form 12 sets of electrodes, with every two cathodes 203 sharing one anode 208. Thus, a total 24 substrates 206 can be deposited with thin film simultaneously. The detailed procedure is described as follows:

a) Placing 24 glass substrates 206 (1640 mm×707 mm×3 mm) each coated with a transparent conductive film of approximately 600 nm thickness in the corresponding 24 substrate locations on the holder 02, with the film side facing outside and the glass side facing the electrode.

b) Opening the movable door on the vacuum chamber door, pushing the holder 02 into the vacuum chamber 01 along tracks 104, and closing the movable door.

c) Reaching a vacuum state of approximately $5.0 \times 10^{-4}$ Pa inside the vacuum chamber and filling in argon gas. When the pressure inside the chamber reaches approximately 60 Pa, turning on the 40.68 MHz VHF power supply, discharging at 400W to clean the chamber for 2 minutes, and turning off the power supply.

d) Reaching a high-degree vacuum state of approximately $5.0 \times 10^{-4}$ Pa and cleaning the chamber twice with argon gas.

e) Pumping in a gas mixture (silane and hydrogen) at 5 slpm into the chamber and, when the pressure inside the chamber reaches approximately 60 Pa, turning on the 40.68 MHz VHF power supply. Afterward, discharging at 400W and depositing microcrystalline silicon intrinsic layer for 40 minutes.

f) Turning off the power supply and reaching a high-degree vacuum state.

g) Filling the chamber with nitrogen gas to atmosphere pressure, opening the vacuum chamber door, pushing out holder 02, and cooling the TCO glasses at room temperature.

The Third Embodiment

The electrode plates are arranged vertically, the feed-in port on the cathode plate is of a triangular shape, the feed-in component is of a cylinder shape, and anti-interference devices (not shown) are arranged between the holders.

Figure 8:
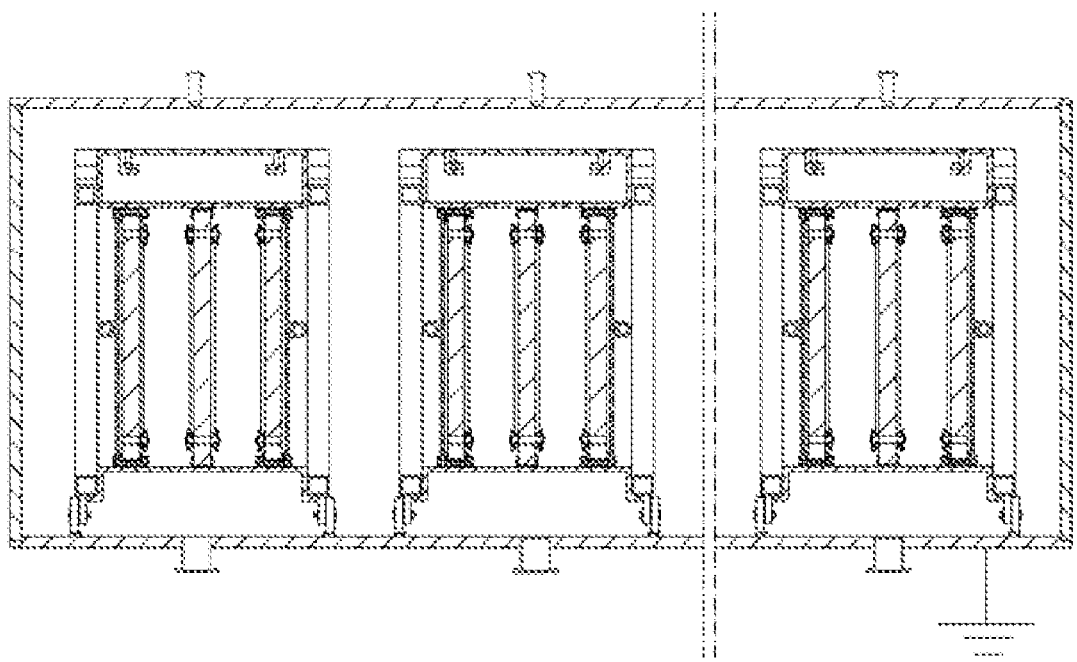
FIG. 8 is the structural diagram of a holder array according to the third embodiment of the present invention.

The holder in FIG. 8 is similar to that in the first embodiment. In this embodiment, a total of six (6) holders 02 are used to deposit thin film on 24 substrates simultaneously. Each holder 02 contains two cathode plates 203 sharing one anode plate 208 to form two sets of electrodes. Thus, a total of 24 substrates 206 can be deposited with thin film simultaneously.

a) Placing 24 glass substrates 206 (1640 mm×707 mm×3 mm) each coated with a transparent conductive film of approximately 600 nm thickness in the corresponding 24 substrate locations on the 6 holders 02, with the film side facing outside and the glass side facing the electrode plates.

b) Opening the movable door on the vacuum chamber door, pushing the movable holders 02 into the vacuum chamber 01 along tracks 104, and closing the movable door of the vacuum chamber.

c) Reaching a vacuum state of approximately $5.0 \times 10^{-4}$ Pa inside the vacuum chamber and filling in argon gas. When the pressure inside the chamber reaches approximately 60 Pa, turning on the 40.68 MHz VHF power supply, discharging at 400W to clean the chamber for 2 minutes, and turning off the power supply.

d) Reaching a high-degree vacuum state of approximately $5.0 \times 10^{-4}$ Pa and cleaning the chamber twice with argon gas.

e) Pumping in a gas mixture (silane and hydrogen) at 5 slpm into the chamber and, when the pressure inside the chamber reaches approximately 60 Pa, turning on the 40.68 MHz VHF power supply. Further, discharging at 400 W and depositing microcrystalline silicon intrinsic layer for 40 minutes.

f) Turning off the power supply and reaching a high-degree vacuum state.

g) Filling the chamber with nitrogen gas to atmosphere pressure, opening the vacuum chamber door, pushing out holders 02, and cooling the TCO glasses at room temperature.

The above detailed explanations illustrate embodiments of the present invention together with accompanying figures. However, the present invention is not limited by the embodiments, especially with respect to the shapes of the feed-in components and cathode plates. Those of ordinary skill in the art can make various changes without departing from the principles and purposes of the present invention.

What is claimed is:

1. A movable holder for silicon thin-film solar cells, comprising:
    electrode plates arranged in parallel;
    a signal feed-in component; and
    a supporting frame, wherein:
    the supporting frame is a movable frame with grounded side frames and insulation and shielding arrangement;
    the signal feed-in component includes a waist and a head forming a cylindrical and stair-shaped conductor, one end of which is of a triangular shape and makes surface contact with a feed-in port of a cathode plate of the electrode plates;
    the feed-in port is located in a hollowed triangular area at the center of the backside of the electrode plate; and
    a shielding layer of the electrode plate feeding-in RF/VHF power supply signals is connected to ground.

2. The movable holder for silicon thin-film solar cells according to claim 1, wherein:
    the electrode plates are arranged in the supporting frame to form the holder, and anti-interference metal shielding screens are arranged between holders or holder arrays.

3. The movable holder for silicon thin-film solar cells according to claim 2, wherein the holder array includes:
    an electrode array separated by a certain discharging distance formed by a combination of several sets of electrode plates and the supporting frame or a holder array formed by the electrode array.

4. The movable holder for silicon thin-film solar cells according to claim 1, wherein the insulation and shielding arrangement includes:
    a grounded metal shielding cover of the shielding layer of the cathode plate of the electrode plates; and
    a through hole arranged on the shielding cover.

5. The movable holder for silicon thin-film solar cells according to claim 1, wherein the shielding layer includes an insulation layer between a metal shielding cover and the back of the cathode plate of the electrode plates.

6. The movable holder for silicon thin-film solar cells according to claim 1, wherein insulation and shielding of the feed-in component includes an outside shielding layer and an insulation layer for the metal feed-in core.

7. The movable holder for silicon thin-film solar cells according to claim 1, wherein:
    a shielding cover of the cathode plate includes a ceramic insulation layer and a shielding layer, the shielding cover covers entire back and side surface of the cathode plate.

8. The movable holder for silicon thin-film solar cells according to claim 1, wherein the signal feed-in component includes:
    a metal feed-in core, which is a conductor formed by RF/VHF feed lines, with a waist covered by a ceramic insulation layer.

9. The movable holder for silicon thin-film solar cells according to claim 1, wherein:
    one end of the signal feed-in component is connected with a negative output port of the RF/VHF power supply signal and a power supply matching device.

10. A power signal feed-in method of a movable holder for silicon thin-film solar cells, comprising:
    arranging electrode plates in parallel and placed in a supporting frame;
    providing at least one signal feed-in component, wherein one end of the signal feed-in component is of a triangular shape;
    transferring, in a surface feed-in mode, RF/VHF power supply signals to a feed-in port of a cathode plate of the electrode plates, wherein the feed-in port is located in a hollowed triangular area at the center of the backside of the cathode plate;
    forming an electrode array in the supporting frame to discharge the RF/VHF power supply signals,
    wherein the signal feed-in component includes a waist and a head forming a cylindrical and stair-shaped conductor.

11. The power signal feed-in method of the movable holder for silicon thin-film solar cells according to claim 10, wherein:

the electrode array includes the electrode plates arranged in the supporting frame and the signal feed-in component, which form the movable holder for discharging the power supply signals, and anti-interference metal shielding screens are placed between holders in a holder array.

12. The power signal feed-in method of the movable holder for silicon thin-film solar cells according to claim 11, wherein the holder array includes:

multiple feed-in components and corresponding electrode plates respectively connected with the feed-in components in a surface feed-in mode to form an electrode array separated by a certain discharging distance.

13. The power signal feed-in method of the movable holder for silicon thin-film solar cells according to claim 11, wherein the signal feed-in component includes:

a metal feed-in core, which is a conductor formed by RF/VHF feed lines, with a waist covered by a ceramic insulation layer.

14. The power signal feed-in method of the movable holder for silicon thin-film solar cells according to claim 11, wherein:

one end of the signal feed-in component is connected with a negative output port of the RF/VHF power supply signal and a power supply matching device.

* * * * *